United States Patent [19]
Lee et al.

[11] Patent Number: 5,846,871
[45] Date of Patent: Dec. 8, 1998

[54] INTEGRATED CIRCUIT FABRICATION

[75] Inventors: Jean Ling Lee; Yi Ma; Sailesh Mansinh Merchant, all of Orlando, Fla.

[73] Assignee: Lucent Technologies Inc., Murray Hill, N.J.

[21] Appl. No.: 918,394

[22] Filed: Aug. 26, 1997

[51] Int. Cl.$^6$ ................................................. H01L 21/283
[52] U.S. Cl. .......................... 438/592; 438/592; 438/585; 438/652; 438/653; 438/655; 438/656; 438/618; 438/621; 438/649; 438/642; 438/625; 259/412; 259/413
[58] Field of Search ..................... 438/592, 618, 438/621, 625, 642, 648, 649, 585, 652, 653, 655, 656; 257/412, 413

[56] References Cited

U.S. PATENT DOCUMENTS

| | | | |
|---|---|---|---|
| 4,745,079 | 5/1988 | Pfiester | 437/29 |
| 4,810,666 | 3/1989 | Taji | 437/30 |
| 4,890,141 | 12/1989 | Tang et al | 357/23.3 |
| 4,900,257 | 2/1990 | Meada | 438/532 |
| 4,978,626 | 12/1990 | Poon et al. | 437/44 |
| 4,997,785 | 3/1991 | Pfiester | 438/153 |
| 5,023,201 | 6/1991 | Stanasolovich et al. | 438/655 |
| 5,027,185 | 6/1991 | Liauh | 257/413 |
| 5,034,348 | 7/1991 | Hartswick et al. | 438/586 |
| 5,064,775 | 11/1991 | Chang | 437/40 |
| 5,075,248 | 12/1991 | Yoon et al. | 437/52 |
| 5,276,347 | 1/1994 | Wei et al. | 257/412 |
| 5,362,981 | 11/1994 | Sato et al. | 257/371 |
| 5,382,831 | 1/1995 | Atakov et al. | 257/767 |
| 5,468,689 | 11/1995 | Cunningham et al. | 437/241 |
| 5,559,047 | 9/1996 | Urabe | 438/301 |
| 5,667,630 | 9/1997 | Lo | 438/653 |
| 5,710,454 | 4/1996 | Wu | 257/413 |
| 5,714,786 | 10/1996 | Gonzales et al. | 257/366 |
| 5,753,565 | 9/1994 | Becker | 438/586 |
| 5,760,475 | 3/1987 | Cronin et al. | 257/758 |

FOREIGN PATENT DOCUMENTS

| | | | |
|---|---|---|---|
| 363058943 | 3/1988 | Japan | 21/88 |
| 363198357 | 8/1988 | Japan | 21/90 |

OTHER PUBLICATIONS

Patent Abstracts of Japan vol. 11, No. 292 (E–543) 19 Sep. 1987 & JP–A–62 092 360 (Toshiba) 27 Apr. 1987 (No translation).

Hitoshi Wakabayashi et al, "Highly Reliable W/TiN/pn–poly–Si Gate CMOS Technology With Simultaneous Gate and Source/Drain Doping Process", IEDM Technical Digest, Dec. 8–11, 1996.

*Primary Examiner*—Charles L. Bowers, Jr.
*Assistant Examiner*—Thanh Nguyen
*Attorney, Agent, or Firm*—Anthony Grillo

[57] ABSTRACT

Undesirable counter doping of $n^+/p^+$ gates illustratively through cross diffusion through an overlying silicide is inhibited by insertion of layers of titanium nitride and titanium, tungsten or tantalum between the polysilicon gates and an overlying silicide.

3 Claims, 1 Drawing Sheet

INTEGRATED CIRCUIT FABRICATION

TECHNICAL FIELD

This invention relates to integrated circuits and methods for their fabrication.

BACKGROUND OF THE INVENTION

Those who manufacturer CMOS integrated circuits utilize designs in which both $n^+$ and $p^+$ polysilicon gates are contained within the same integrated circuits. Such designs are often termed "dual poly gates". Dual poly gates are often used in low power integrated circuits. The $n^+$ polysilicon is normally doped with phosphorus and the $p^+$ polysilicon is normally doped with boron.

Unfortunately, when an $n^+$ gate contacts a $p^+$ gate, counter doping may occur through, for example boron and phosphorus cross-diffusion and a region of poor conductivity may be created where the $n^+$ and the $p^+$ gates contact each other. Furthermore, threshold voltages may shift.

One solution to the above-described problem is to cover the $n^+$ and $p^+$ gates with a layer of refractory metal silicide, such as tungsten silicide. The conductive silicide helps to preserve conduction across the $n^+/p^+$ gate boundary even if counter doping due to cross diffusion should occur. However, it has been found that phosphorus and especially boron dopant species may diffuse from doped polysilicon gates through overlying tungsten silicide, thereby exacerbating the problem which the presence of the tungsten silicide was designed to solve. This diffusion phenomenon is particularly apparent when the tungsten silicide has a polycrystalline form, because boron travels easily along the tungsten silicide grain boundaries.

Those concerned with the development of integrated circuits have continued to search for methods and structures to alleviate the above-described problems.

SUMMARY OF THE INVENTION

Illustratively, the present invention addresses the above concerns by forming an integrated circuit by forming a blanket layer of polysilicon overlying a substrate, the layer of polysilicon having an $n^+$ portion and a $p^+$ portion. A material layer is formed over the polysilicon; titanium nitride is formed over the material layer and a layer of refractory metal silicide is formed over the titanium nitride. The materials are patterned to form a gate stack.

DETAILED DESCRIPTION

Figure 1:
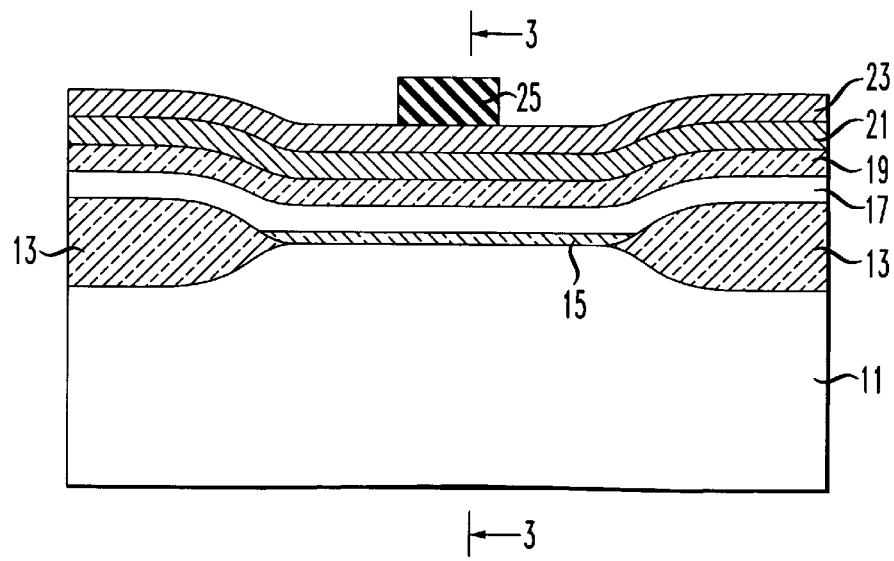
FIGS. 1–3 are partial cross sectional views of a partially fabricated integrated circuit according to an illustrative embodiment of the present invention.

Turning to FIG. 1, reference numeral 11 denotes a substrate which may illustratively be silicon, doped silicon, epitaxial silicon, etc. Field oxide 13 may be formed according to methods known to those of skill in the art, illustratively the LOCOS or poly-buffered LOCOS methods. Reference numeral 15 denotes, illustratively a grown silicon dioxide which may have a thickness between 15 Å and 50 Å. Ultimately layer 15 will serve as gate dielectric. Other dielectrics may also be chosen, i.e. silicon oxynitride, etc. Reference numeral 17 denotes a blanket polysilicon layer which may be formed by methods known to those of skill in the art, illustratively, by low pressure chemical vapor deposition (LPCVD).

Figure 3:
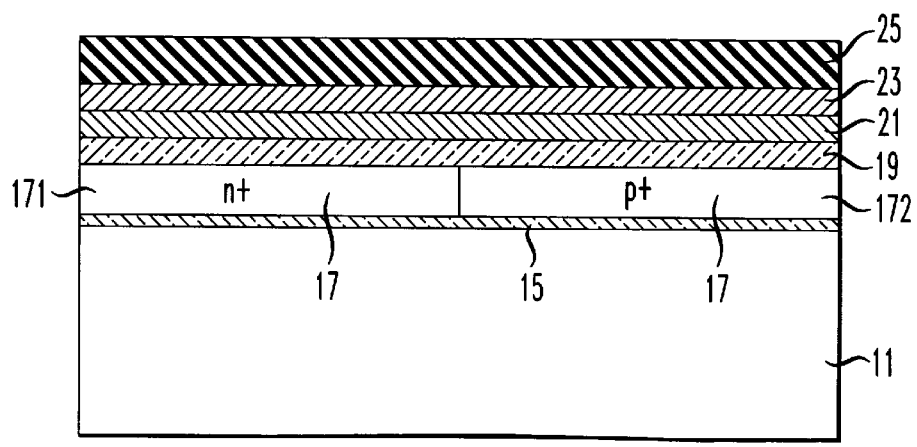

As can be appreciated from examination of FIG. 3, a portion 171 of layer 17 is doped $n^+$ while another portion 172 of layer 17 is doped $p^+$. Such doping is accomplished by methods known to those skilled in the art. Layer 17 is covered by layer 19. Layer 19 is illustratively titanium, although tungsten or tantalum may be employed. Layer 19 improves the sheet resistance of the later-defined gate and also provides a getter for boron. Layer 19 is formed illustratively by conventional physical or chemical vapor deposition techniques.

Layer 21 is illustratively titanium nitride. Titanium nitride forms a barrier to both boron and phosphorus diffusion thereby helping to alleviate the problem previously mentioned. Layer 21 is formed illustratively by physical or chemical vapor deposition techniques. Layer 23 is a refractory metal silicide, illustratively tungsten silicide which may be formed by methods known to those of skill in the art, such as physical or chemical vapor deposition. Reference numeral 25 denotes a patterned overlayer which may illustratively be photoresist, or photoresist covering a patterned hard mask oxide.

Figure 2:
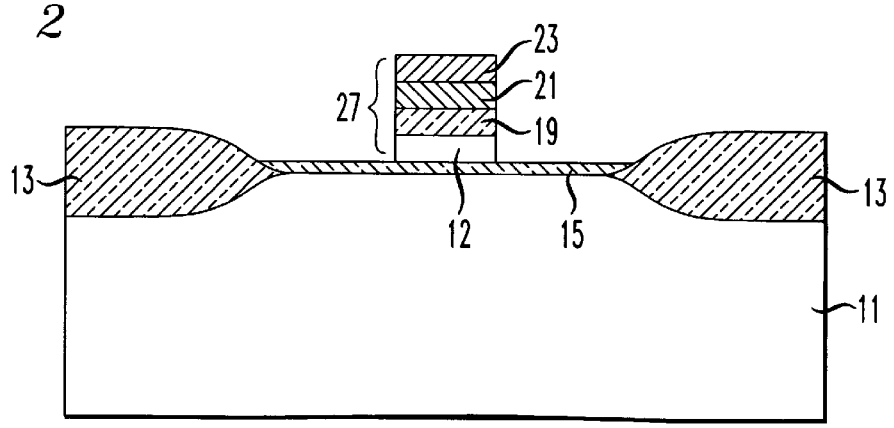

Turning to FIG. 2, the structure of FIG. 1 has been patterned using patterned overlayer 25 as a mask. FIG. 2 depicts gate 27 having a stacked structure comprised of polysilicon 17, layer 19 (which may be illustratively chosen from titanium, tungsten or tantalum), barrier layer 21 and refractory metal silicide 23. Further processing may include: definition of source and drain regions, illustratively by ion implantation; deposition of dielectric; opening of windows; forming of metal contacts; and creation of further levels of metal separated by dielectric.

As can be appreciated from a view of FIG. 3, the illustrated gate structure permits effective operation of adjacent $n^+$ and $p^+$ gates without undesirable diffusion through overlying silicide layers.

The invention claimed is:

1. A method of integrated circuit fabrication comprising:

forming a blanket layer of polysilicon overlying a substrate, said layer of polysilicon having an $n^+$ portion and a $p^+$ portion;

forming a layer of titanium contacting said layer of polysilicon;

forming a layer of titanium nitride contacting said layer of titanium; and forming a layer of a refractory metal silicide contacting said layer of titanium nitride;

patterning said layer of refractory metal silicide and said layer of titanium nitride and said layer of titanium and said layer of polysilicon to form a gate stack.

2. A method of integrated circuit fabrication comprising:

forming a blanket layer of polysilicon overlying a substrate, said layer of polysilicon having an $n^+$ portion and a $p^+$ portion;

forming a layer of tungsten contacting said layer of polysilicon;

forming a layer of titanium nitride contacting said layer of tungsten;

forming a layer of a refractory metal silicide contacting said layer of titanium nitride;

patterning said layer of refractory metal silicide and said layer of titanium nitride and said layer of tungsten and said layer of polysilicon to form a gate stack.

3. A method of integrated circuit fabrication comprising:

forming a blanket layer of polysilicon overlying a substrate, said layer of polysilicon having an $n^+$ portion and a $p^+$ portion;

forming a layer of tantalum contacting said layer of polysilicon;

forming a layer of titanium nitride contacting said layer of tantalum; and forming a layer of a refractory metal silicide contacting said layer of titanium nitride;

patterning said layer of refractory metal silicide and said layer of titanium nitride and said layer of tantalum and said layer of polysilicon to form a gate stack.

* * * * *

UNITED STATES PATENT AND TRADEMARK OFFICE
CERTIFICATE OF CORRECTION

PATENT NO. : 5,846,871
DATED : December 8, 1998
INVENTOR(S) : Jean Ling Lee; Sailesh Mansihn Merchant It is certified that error appears in the above-identified patent and that said Letters Patent is hereby corrected as shown below:

Figure 2, Reference numeral "12" - should be -- 17 --.

Signed and Sealed this

Tenth Day of October, 2000

Attest:

Attesting Officer

Q. TODD DICKINSON

Director of Patents and Trademarks